(12) United States Patent
Lee et al.

(10) Patent No.: US 9,202,965 B2
(45) Date of Patent: Dec. 1, 2015

(54) METHOD FOR MANUFACTURING SOLAR CELL

(71) Applicant: JUSUNG ENGINEERING CO., LTD., Gwangju-si, Gyeonggi-do (KR)

(72) Inventors: Sang Du Lee, Gwangju-si (KR); Joung Sik Kim, Yongin-si (KR); Joung Ho Ahn, Icheon-si (KR); Rae Wook Jeong, Suwon-si (KR); Byung Wook Jung, Gwangju-si (KR); Beop Jong Jin, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

(21) Appl. No.: 14/360,930

(22) PCT Filed: Dec. 14, 2012

(86) PCT No.: PCT/KR2012/010888
§ 371 (c)(1),
(2) Date: May 27, 2014

(87) PCT Pub. No.: WO2013/089473
PCT Pub. Date: Jun. 20, 2013

(65) Prior Publication Data
US 2014/0302620 A1    Oct. 9, 2014

(30) Foreign Application Priority Data

Dec. 16, 2011    (KR) .................. 10-2011-0135989
Nov. 14, 2012    (KR) .................. 10-2012-0128973

(51) Int. Cl.
*H01L 31/18*        (2006.01)
*H01L 31/0236*      (2006.01)
*H01L 31/068*       (2012.01)

(52) U.S. Cl.
CPC .......... *H01L 31/18* (2013.01); *H01L 31/02363* (2013.01); *H01L 31/068* (2013.01); *H01L 31/1804* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 8,623,688 B2 * | 1/2014 | Geerligs et al. .................. 438/57 |
| 2010/0326504 A1 * | 12/2010 | Park et al. ...................... 136/255 |
| 2011/0253210 A1 | 10/2011 | Lee et al. |
| 2014/0305501 A1 * | 10/2014 | Li et al. .......................... 136/256 |

FOREIGN PATENT DOCUMENTS

| | | |
|---|---|---|
| CN | 10183897 A | 10/2010 |
| JP | 2004-281798 A | 10/2004 |
| JP | 2007-142471 A | 6/2007 |

(Continued)

*Primary Examiner* — Khaja Ahmad

(57) ABSTRACT

A method for manufacturing a solar cell capable of significantly reducing the amount of wastewater generated during a wet-etching process and improving the efficiency of the solar cell. A method comprising: texturing to form an uneven structure on one semiconductor substrate surface by etching the semiconductor substrate surface with a texturing device; forming a temporary layer at an upper portion of the semiconductor substrate surface to surround a first byproduct layer formed at a predetermined region of the semiconductor substrate surface during the texturing; and doping the semiconductor substrate surface with a predetermined dopant using a doping device to form a first semiconductor layer and a second semiconductor layer disposed above the first semiconductor layer and having a different polarity than the first semiconductor layer. The first byproduct layer and the temporary layer are simultaneously removed.

22 Claims, 11 Drawing Sheets

(56) References Cited

FOREIGN PATENT DOCUMENTS

| KR | 2011-0003788 A | 1/2011 |
| KR | 2011-0004133 A | 1/2011 |
| WO | 2010105703 A1 | 9/2010 |

\* cited by examiner

METHOD FOR MANUFACTURING SOLAR CELL

TECHNICAL FIELD

The present invention relates to a method for manufacturing a solar cell, and more particularly, to a method for manufacturing a solar cell to considerably reduce an amount of waste water discharged during wet etching and improve efficiency of the solar cell.

BACKGROUND ART

A solar cell is a device which converts light into electric energy using semiconductor properties.

The solar cell has a PN junction structure in which a positive (p)-type semiconductor is junctioned to a negative (n)-type semiconductor. When sunlight is incident upon the solar cell having this structure, holes and electrons are generated by the incident sunlight energy in the semiconductor. At this time, because of an electric field generated by the PN junction, the holes (+) move to the p-type semiconductor and the electrons (−) move to the n-type semiconductor, thus causing occurrence of an electric potential and thereby producing power.

Such a solar cell may be classified into a thin film-type solar cell and a substrate-type solar cell.

The thin film-type solar cell is manufactured by forming a semiconductor in the form of a thin film on a substrate such as glass, while the substrate-type solar cell is manufactured using a semiconductor material such as silicon as a substrate.

The substrate-type solar cell has disadvantages of large thickness and use of expensive materials as compared to the thin film-type solar cell, but has an advantage of high cell efficiency.

Hereinafter, a conventional substrate-type solar cell will be described with reference to the annexed drawings.

FIG. 1 is a schematic sectional view illustrating a conventional substrate-type solar cell.

As shown in FIG. 1, the conventional substrate-type solar cell includes a p-type semiconductor layer 10, an n-type semiconductor layer 20, an anti-reflective layer 30, a front electrode 40, a p+-type semiconductor layer 50 and a rear electrode 60.

The p-type semiconductor layer 10 and the n-type semiconductor layer 20 formed on the p-type semiconductor layer 10 form a PN junction of the solar cell.

The anti-reflective layer 30 is formed on the n-type semiconductor layer 20 to prevent reflection of sunlight.

The p+-type semiconductor layer 50 is formed under the p-type semiconductor layer 10 to prevent recombination and decay of carriers formed by sunlight.

The front electrode 40 extends from the anti-reflective layer 30 to the n-type semiconductor layer 20 and the rear electrode 60 is formed under the p+-type semiconductor layer 50.

In accordance with the conventional substrate-type solar cell, when sunlight is incident thereupon, electrons and holes are produced, the produced electrons move through the n-type semiconductor layer 20 to the front electrode 40, and the produced holes move through the p+-type semiconductor layer 50 to the rear electrode 60. The conventional substrate-type solar cell is manufactured by the following process.

FIGS. 2A to 2H are sectional views illustrating a process for manufacturing the conventional substrate-type solar cell.

First, as shown in FIG. 2A, a p-type semiconductor substrate 10a is prepared.

Next, as shown in FIG. 2B, one surface of the semiconductor substrate 10a is etched to form a roughness structure on one surface of the semiconductor substrate 10a.

The etching one surface of the semiconductor substrate 10a may be carried out using reactive ion etching (RIE). Reactive ion etching is an etching process using a determined reaction gas in a high-voltage plasma state.

Meanwhile, as illustrated in the drawing, when one surface of the semiconductor substrate 10a is etched using reactive ion etching, a damaged layer formed by high-voltage plasma on one surface of the semiconductor substrate 10a and/or a first by-product layer comprising a reaction product 14 containing a substance based on SiOx or Si—O—F—S and being formed on peaks of the roughness structure remains.

Next, as shown in FIG. 2C, the first by-product layer formed on one surface of the semiconductor substrate 10a is removed.

The removal of the first by-product layer 14 is carried out by wet etching using an etchant.

Next, as shown in FIG. 2D, one surface of the semiconductor substrate 10a is doped with an n-type dopant to form a PN junction. That is, as a result of doping one surface of the semiconductor substrate 10a with the n-type dopant, the p-type semiconductor layer 10 not-doped with the dopant and the n-type semiconductor layer 20 doped with the dopant are sequentially formed to constitute a PN junction.

Meanwhile, the process for doping the n-type dopant is carried out at a high temperature. As a result of the doping process, a second by-product layer 22 such as phosphor-silicate glass (PSG) is formed on the n-type semiconductor layer 20.

Next, as shown in FIG. 2E, the second by-product layer 22 is removed.

The removal of the second by-product layer 22 is carried out by wet etching using an etchant.

Next, as shown in FIG. 2F, an anti-reflective layer 30 is formed on the n-type semiconductor layer 20.

Next, as shown in FIG. 2G, a front electrode material 40a is applied to an upper surface of the anti-reflective layer 30 and a rear electrode material 60a is applied to a lower surface of the p-type semiconductor layer 10.

Next, as shown in FIG. 2H, the resulting structure is fired at a high temperature to complete fabrication of the substrate-type solar cell shown in FIG. 1.

That is, as a result of firing at a high temperature, the front electrode material 40a passes through the anti-reflective layer 30 and extends to the n-type semiconductor layer 20 to form a front electrode 40, and the rear electrode material 60a permeates into the lower surface of the p-type semiconductor layer 10 to form a p$^+$-type semiconductor layer 50 on the lower surface of the p-type semiconductor layer 10 and form a rear electrode 60 thereon.

In order to implement the process of manufacturing the conventional substrate-type solar cell, a system for manufacturing the conventional substrate-type solar cell has the following configuration.

FIG. 3 is a block diagram schematically illustrating a conventional system for manufacturing a solar cell.

As shown in FIG. 3, the conventional system for manufacturing a substrate-type solar cell includes a texturing device 91, a first wet etching device 92, a doping device 93, a second wet etching device (that is, phosphor-silicate glass (PSG) removal device) 94, an anti-reflection coating (ARC) formation device 95, a metal electrode coating device 96 and a firing device 97.

The texturing device (for example, reactive ion etching (RIE) device 91) performs the process shown in FIG. 2B. The first wet etching device 92 performs the process shown in FIG. 2C. The doping device 93 performs the process shown in FIG. 2D. The second wet etching device 94 performs the process shown in FIG. 2E. The anti-reflection coating formation device 95 performs the process shown in FIG. 2F. The metal electrode coating device 96 performs the process shown in FIG. 2G. The firing device 97 performs the process shown in FIG. 2H.

DISCLOSURE OF INVENTION

Technical Problem

As such, the conventional process for manufacturing the substrate-type solar cell requires the first wet etching device for removing the first by-product layer which is the reaction product layer formed during the texturing process. Because of wet etching, a great amount of waste water is discharged during the overall process for manufacturing the solar cell, thus disadvantageously causing environmental pollution. In addition, the conventional method has problems in that the first by-product layer is not readily removed from the semiconductor substrate by wet etching and remains on the semiconductor substrate, thus interfering with the process for manufacturing the solar cell, or reducing efficiency of the manufactured solar cell.

Technical Solution

Accordingly, the present invention is directed to a method for manufacturing a solar cell that substantially obviates one or more problems due to limitations and disadvantages of the related art.

One object of the present invention is to provide a method for manufacturing a solar cell.

More specifically, one object of the present invention is to provide a method for manufacturing a solar cell including removing a first byproduct layer (that is, reaction byproduct and/or damaged layer) without wet etching after dry texturing.

Another object of the present invention is to provide a method for manufacturing a solar cell capable of easily and completely removing a first byproduct layer (that is, reaction product and/or damaged layer).

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a solar cell includes steps of: texturing a surface of a semiconductor substrate in a texturing device to etch the surface of a semiconductor substrate and thereby form a roughness structure on the surface of the substrate; forming a temporary layer on the surface of the semiconductor substrate such that the temporary layer surrounds a first byproduct layer formed in a predetermined region on the surface of the semiconductor substrate during the step of texturing; and doping the surface of the semiconductor substrate with a dopant in a doping device to form a first semiconductor layer and a second semiconductor layer disposed on the first semiconductor layer and having a polarity different from that of the first semiconductor layer, and wherein the first byproduct layer and the temporary layer are simultaneously removed.

The step of texturing may be carried out by dry etching.

The step of forming a temporary layer may be continuously performed in the texturing device after completion of the step of texturing.

The step of forming a temporary layer may include steps of: loading the semiconductor substrate in the texturing device after the step of texturing; injecting at least one of a nitrogen (N)-based gas, a hydrogen (H)-based gas, an oxygen (O)-based gas, a fluorine (F)-based gas and a mixture thereof into the texturing device; applying plasma to the texturing device; and adjusting an inner temperature of the texturing device to a predetermined first temperature.

The predetermined first temperature may be 100° C. or less.

The step of forming a temporary layer may be carried out in a subsidiary device provided between the texturing device and the doping device.

The step of forming a temporary layer may include steps of: loading the semiconductor substrate in the subsidiary device; injecting at least one of a nitrogen (N)-based gas, a hydrogen (H)-based gas, an oxygen (O)-based gas, a fluorine (F)-based gas and a mixture thereof into the subsidiary device; applying plasma to the subsidiary device; and adjusting an inner temperature of the subsidiary device to a predetermined first temperature.

The predetermined first temperature may be 100° C. or less.

The simultaneous removal of the first byproduct layer and the temporary layer may include steps of: loading the semiconductor substrate in the doping device; elevating an inner temperature of the doping device to a predetermined second temperature lower than a doping temperature; and evaporating the first byproduct layer and the temporary layer.

The doping may be carried out after the step of evaporating the first byproduct layer and the temporary layer and then discharging gases left in the doping devices.

The simultaneous removal of the first byproduct layer and the temporary layer may include steps of: loading the semiconductor substrate in a high-temperature chamber disposed between the texturing device and the doping device; elevating an inner temperature of the high-temperature chamber to a predetermined second temperature; and evaporating the first byproduct layer and the temporary layer.

The predetermined second temperature may be 150° C. or more.

In another aspect of the present invention, a method for manufacturing a solar cell includes steps of: texturing a surface of a semiconductor substrate in a texturing device to etch the surface of a semiconductor substrate and thereby form a roughness structure on the surface of the substrate; doping the surface of the semiconductor substrate with a dopant in a doping device to form a first semiconductor layer and a second semiconductor layer disposed on the first semiconductor layer and having a polarity different from that of the first semiconductor layer; and removing the second byproduct layer formed on the second semiconductor layer during the step of doping, wherein a temporary layer is formed on the surface of the semiconductor substrate during the step of texturing such that the temporary layer surrounds the first byproduct layer formed in a predetermined region on the surface of the semiconductor substrate and the first byproduct layer and the temporary layer are simultaneously removed.

The temporary layer may be a second byproduct layer.

The step of doping may be carried out such that the second byproduct layer surrounds the upper surfaces of the first byproduct layer and the semiconductor substrate.

The first byproduct layer and the temporary layer may be removed during the step of removing the second byproduct.

The step of removing the second byproduct may be carried out by wet etching.

In another aspect of the present invention, a method for manufacturing a solar cell includes steps of: texturing a surface of a semiconductor substrate to etch the surface of a semiconductor substrate by reactive ion etching and thereby form a roughness structure on the surface of the substrate; and removing a first byproduct layer including a damaged layer and a reaction product formed on the surface of the semiconductor substrate by reactive ion etching, wherein the step of removing a first byproduct layer is carried out such that a peak of the roughness structure has a round shape.

The round shaped roughness structure may have a width (L) of 100 nm to 500 nm and a height (H) of 50 nm to 400 nm.

The step of removing a first byproduct layer may be carried out using a mixed gas of $SF_6$ and $Cl_2$, and a mix ratio (sccm) of $SF_6$ and $Cl_2$ is $SF_6:Cl_2=3:(1$ to $3)$.

The step of removing a first byproduct layer may be carried out at an RF power of 7 to 15 Kw and at an inner pressure of a chamber of 0.2 to 0.5 torr.

The step of texturing and the step of removing a first byproduct layer may be continuously performed in the same reactive ion etching equipment.

It is to be understood that both the foregoing general description and the following detailed description of the present invention are exemplary and explanatory and are intended to provide further explanation of the invention as claimed.

Advantageous Effects

As described above, according to the present invention, the first byproduct layer can be formed without wet etching after dry texturing. For this reason, according to the present invention, the first wet etching equipment is unnecessary, thus reducing costs required for manufacture of the solar cell and considerably decreasing waste water discharged during wet etching, as compared to conventional methods requiring two wet etching devices.

The etching one surface of the substrate and the removing the damaged layer and the reaction product formed on one surface of the substrate are carried out using reactive ion etching, thus eliminating the necessity of moving the substrate between vacuum and atmospheric pressure conditions, as compared to conventional methods and simplifying the overall process.

Also, the present invention is effective in decreasing the amount of required equipment and thus reducing cost corresponding thereto, since etching one surface of the semiconductor substrate and removing the damaged layer and the reaction product formed on one surface of the semiconductor substrate are continuously performed using reactive ion etching.

Apparent from the fore-going, according to the present invention, the first byproduct layer can be formed without wet etching after dry texturing. For this reason, according to the present invention, the first wet etching equipment is unnecessary, thus reducing costs required for manufacture of the solar cell and considerably decreasing waste water discharged during wet etching, as compared to conventional methods requiring two wet etching devices.

The etching one surface of the substrate and the removing the damaged layer and the reaction product formed on one surface of the substrate are carried out using reactive ion etching, thus eliminating the necessity of moving the substrate between vacuum and atmospheric pressure conditions, as compared to conventional methods and simplifying the overall process.

Also, the present invention is effective in decreasing the amount of required equipment and thus reducing cost corresponding thereto, since etching one surface of the semiconductor substrate and removing the damaged layer and the reaction product formed on one surface of the semiconductor substrate are continuously performed using reactive ion etching.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

BEST MODE

Reference will now be made in detail to the preferred embodiments of the present invention, examples of which are illustrated in the accompanying drawings. However, the present invention is not limited to the embodiments described herein and embodied as other embodiments. The embodiments are provided for complete understanding of the present invention and to inform those skilled in the art of the technical concept of the present invention. Wherever possible, the same reference numbers will be used throughout the drawings to refer to the same or like parts.

FIGS. 4A to 4I are sectional views illustrating a method for manufacturing a solar cell according to a first embodiment of the present invention.

Figure 1:
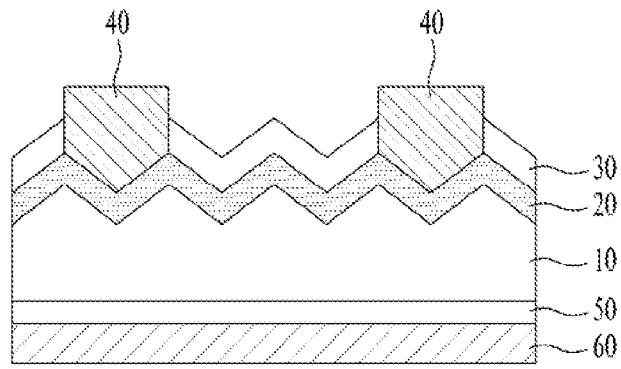
FIG. 1 is a schematic sectional view illustrating a conventional substrate-type solar cell.
Figure 2A:
FIGS. 2A to 2H are sectional views illustrating a process for manufacturing the conventional substrate-type solar cell.
Figure 2B:
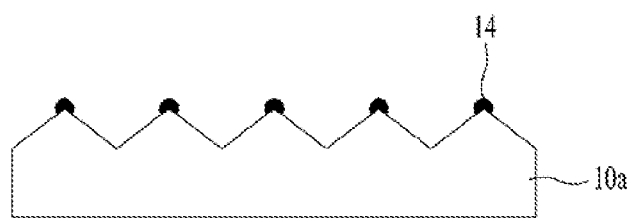
Figure 2C:
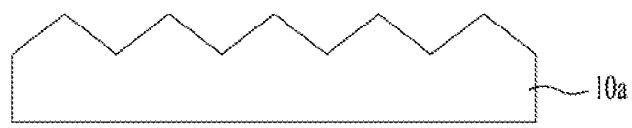
Figure 2D:
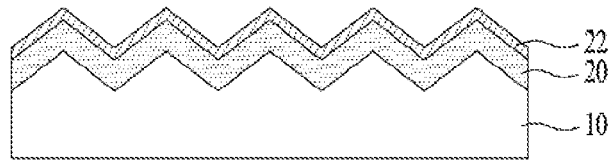
Figure 2E:
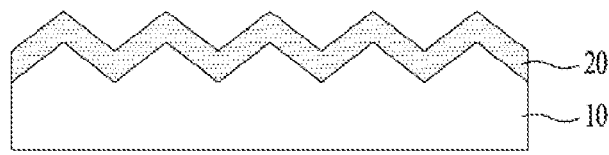
Figure 2F:
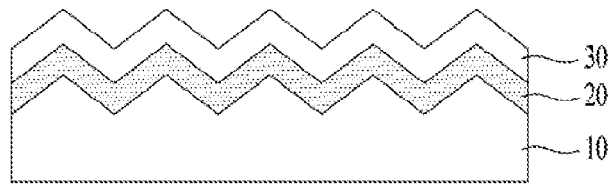
Figure 2G:
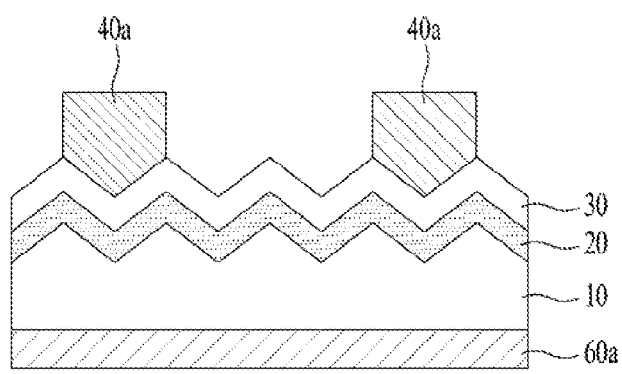
Figure 2H:
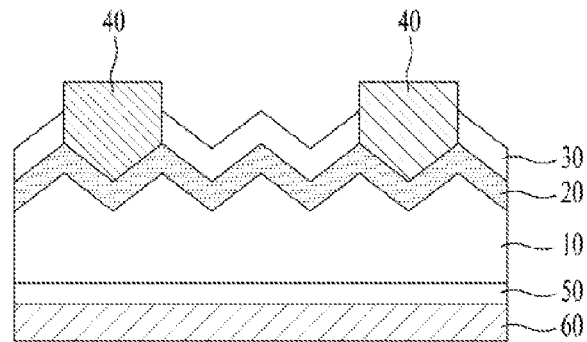
Figure 3:
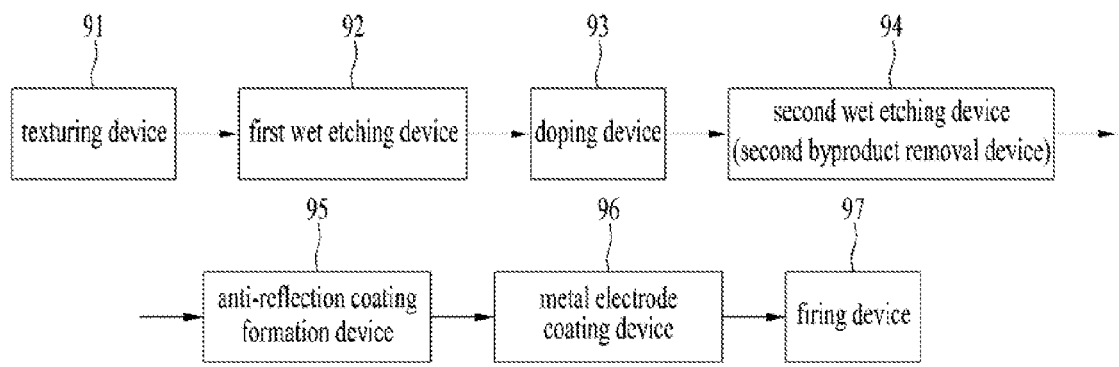
FIG. 3 is a block diagram schematically illustrating a conventional system for manufacturing a solar cell.
Figure 4A:
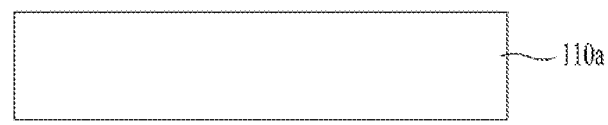
FIGS. 4A to 4I are sectional views illustrating a method for manufacturing a solar cell according to a first embodiment of the present invention.

First, as shown in FIG. 4A, a semiconductor substrate 110a is prepared.

Preparation of the semiconductor substrate 110a is performed by forming a wafer-shaped semiconductor substrate 110a with a silicon ingot using a diamond type sawing machine or a slurry type sawing machine, and removing sawing damage formed on the surface of the semiconductor substrate 110a due to the wafer sawing machine. The removal of the sawing damage may be carried out by wet etching.

The semiconductor substrate 110a may be a silicon substrate, for example, a p-type silicon substrate.

The silicon substrate may utilize monocrystalline silicon or polycrystalline silicon. The monocrystalline silicon exhibits high solar cell efficiency due to high purity and low crystal defect density, but disadvantageously has low economic efficiency due to excessively high price. The polycrystalline silicon has relatively low efficiency, but has a low manufacturing cost due to use of low-cost materials and processes, thus being suitable for mass-production.

Figure 4B:
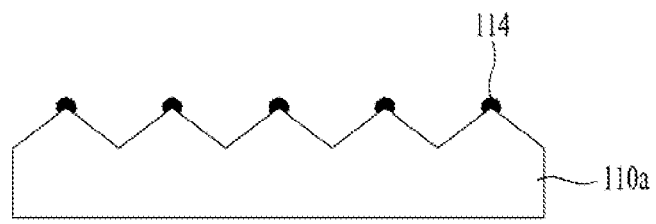

Next, as shown in FIG. 4B, one surface of the semiconductor substrate 110a is etched using the texturing device 191 to form a roughness structure on the semiconductor substrate 110a. That is, one surface of the semiconductor substrate 110a is subjected to texturing.

The texturing is carried out by dry etching.

In particular, preferably, the texturing may be carried out using reactive ion etching (RIE).

The reactive ion etching may be carried out using $C_{12}$, $SF_6$, $NF_3$, HBr or a mixture of two or more thereof as a major gas, and Ar, $O_2$, $N_2$, He or a mixture of two or more thereof as an additive gas.

As such, when the semiconductor substrate 110a is etched using reactive ion etching, the first byproduct layer 114 may remain on one surface of the semiconductor substrate 110a due to high-voltage plasma, and the first byproduct layer includes a damaged layer formed on one surface of the semiconductor substrate, and/or a reaction product such as SiOx or a reaction product containing a substance based on Si—O—F—S formed on peaks of the roughness. For clearer description, in accordance with the method for manufacturing a solar cell according to the present invention, the first byproduct layer contains a reaction product such as SiOx or a reaction product containing a substance based on Si—O—F—S formed on peaks of the roughness. Hereinafter, the description according to the embodiment is made based on a process for removing the reaction products.

The first byproduct layer 114 is made of a Si-based substance and the semiconductor substrate 110a is also made of Si. For this reason, the first byproduct layer 114 is strongly bonded to the semiconductor substrate 110a.

Figure 4C:
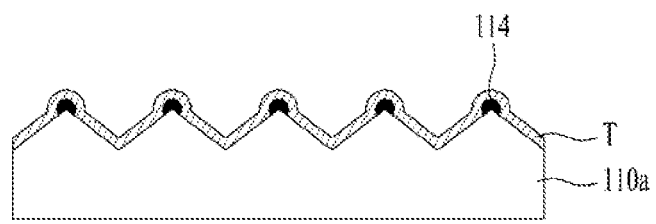

Next, as shown in FIG. 4C, a temporary layer T is formed on the top of one surface of the semiconductor substrate 110a such that the temporary layer T covers the top of the first byproduct layer 114 produced during the texturing and/or the top of the semiconductor substrate 110a. That is, the temporary layer T is formed on the semiconductor substrate 110a so as to surround the first byproduct layer 114 (or includes the first byproduct layer 114).

In one embodiment, the temporary layer T may be continuously formed on the top of the semiconductor substrate 110a in the texturing device 191 after the texturing step.

Specifically, after the texturing step, residual gases present in the texturing device 191 are discharged and the semiconductor substrate 110a remains in the texturing device 191. Next, at least one of a nitrogen (N)-based gas, a hydrogen (H)-based gas, an oxygen (O)-based gas, a fluorine (F)-based gas or a mixture thereof is injected into the texturing device 191 and plasma is applied to the texturing device 191 (that is, radio frequency (RF) power is applied). At this time, the application of plasma is performed until an inner temperature of the texturing device 191 reaches a predetermined first temperature (that is, the radio frequency (RF) power is applied to the texturing device 191 until the temperature of the texturing device 191 reaches the predetermined first temperature).

In another embodiment, a subsidiary device 192 may be further provided between the texturing device 191 and the doping device 194 and the temporary layer T may be formed in the subsidiary device 192. That is, the temporary layer T may be formed in a separate device other than the texturing device 191.

In this case, similar to the embodiment above, after the texturing step, the semiconductor substrate 110a in the texturing device 191 is loaded in the subsidiary device 192. Next, at least one of a nitrogen (N)-based gas, a hydrogen (H)-based gas, an oxygen (O)-based gas, a fluorine (F)-based gas or a mixture thereof is injected into the subsidiary device 192 and plasma is applied to the subsidiary device 192. At this time, application of the plasma is performed until the inner temperature of the texturing device 191 reaches the predetermined first temperature.

Preferably, the predetermined first temperature may be 100° C. or less.

As a result, a temporary layer T made of a substance based on N—H—Si—F—O—S is for example formed on the top of the first byproduct layer 114 and/or the top of the semiconductor substrate 110a. Here, the Si component of the temporary layer T may be obtained by absorption or diffusion of the Si component from the first byproduct layer 114 and/or the semiconductor substrate 110a. For this reason, the first byproduct layer 114 diffuses the Si component present therein into the temporary layer T, thus reducing a concentration of the Si component of the first byproduct layer 114 and considerably reducing bonding between the first byproduct layer 114 and the semiconductor substrate 110a. That is, the formation of the temporary layer T enables the first byproduct layer 114 to be easily peeled.

Figure 4D:
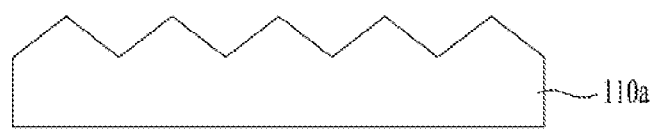

Next, as shown in FIG. 4D, the first byproduct layer 114 remaining on one surface of the semiconductor substrate 110a and the temporary layer T surrounding the first byproduct layer 114 are simultaneously removed.

In one embodiment, a high-temperature chamber 193 to increase the temperature of the semiconductor substrate 110a to a predetermined second temperature may be provided between the texturing device 191 and the doping device 194 or between the subsidiary device 192 and the doping device 194. In this case, after formation of the temporary layer T, the semiconductor substrate 110a is inserted into the high-temperature chamber 193, an inner temperature of the high-temperature chamber 193 is elevated to the predetermined second temperature, and the first byproduct layer 114 and the temporary layer T are separated from the semiconductor substrate 110a and these layers are evaporated.

At this time, preferably, the predetermined second temperature may be 150° C. or more.

As described in the formation of the temporary layer T above, since the Si component is absorbed from the first byproduct layer 114 to the temporary layer T, a concentration of the Si component in the first byproduct layer 114 is decreased or the Si component of the first byproduct layer 114 is diluted, and the first byproduct layer 114 is readily separated from the semiconductor substrate 110a, is decreased in melting point and is thus readily evaporated.

The evaporation of the readily separated and evaporated first byproduct layer 114 in a separate high-temperature chamber 193 enables complete and easy removal of the first byproduct layer 114 without contamination of the first byproduct layer 114 and the temporary layer T evaporated in other device (for example, the doping device 194) used for manufacture of the solar cell. In addition, the first byproduct layer 114 can be removed using only a high-temperature chamber 193 which is much cheaper than the wet etching device without using a wet etching process and a device for removing the first byproduct layer 114, the cost of equipment used for manufacture of the solar cell can be reduced and an amount of waste water discharged during wet etching can be considerably reduced, as compared to conventional methods requiring two wet etching devices.

In another embodiment, the simultaneous removal of the first byproduct layer 114 and the temporary layer T may be performed in the doping device 194 without using a separate high-temperature chamber 193. This process will be described in detail in the following doping process.

Figure 4E:
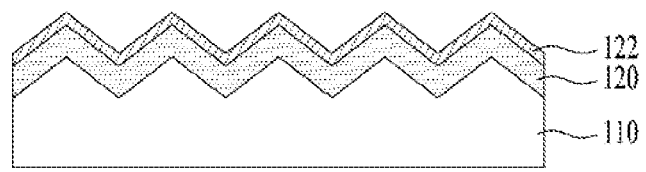

Next, as shown in FIG. 4E, one surface of the semiconductor substrate 110a is doped with a dopant to form a PN junction layer including a first semiconductor layer 110 and a second semiconductor layer 120 that is disposed on the first semiconductor layer 110 and has a polarity different from that of the first semiconductor layer 110. That is, when one surface of the semiconductor substrate 110a is doped with the dopant, the undoped first semiconductor layer 110 and the doped second semiconductor layer 120 are sequentially formed to form the PN junction.

For example, when the semiconductor substrate 110a is realized with a p-type semiconductor layer, a first semiconductor layer 110 formed of a p-type semiconductor layer and a second semiconductor layer 120 formed of the n-type semiconductor layer can be formed on one surface of the first semiconductor layer 110 by doping the n-type dopant.

As described above, simultaneous removal of the first byproduct layer 114 and the temporary layer T may be carried out in the doping device 194 without using a separate high-temperature chamber 193. Specifically, simultaneous removal of the first byproduct layer 114 and the temporary layer T may be carried out by loading the semiconductor substrate 110a in the doping device 194 and elevating an inner temperature of the doping device 194 to a predetermined second temperature lower than a doping temperature to evaporate the first byproduct layer 114 and the temporary layer T. Next, the first byproduct layer 114 and the temporary layer T evaporate to discharge gases remaining in the doping device 194 and the semiconductor substrate 110a present in the doping device 194 may be doped by high-temperature diffusion or plasma ion doping. At this time, preferably, the predetermined second temperature is 150° C. or higher. As such, by simultaneously removing the first byproduct layer 114 and the temporary layer T by evaporation without using a separate high-temperature chamber 193, equipment cost required for manufacturing solar cells can be reduced and the amount waste water discharged during wet etching can be considerably reduced, as compared to conventional methods requiring two wet etching devices.

More specifically, the doping process may be carried out using high-temperature diffusion or plasma ion doping.

The process for doping the n-type dopant using the high-temperature diffusion includes loading the semiconductor substrate 110a in a diffusion reactor at a high temperature of about 800° C. or more and supplying an n-type dopant gas such as POCl3 or PH3 to the diffusion reactor to diffuse the n-type dopant into the surface of the semiconductor substrate 110a.

The process for doping the n-type dopant using the plasma ion doping may include loading the semiconductor substrate 110a in a plasma generator and supplying an n-type dopant gas such as $POCl_3$ or $PH_3$ thereto to generate plasma. When plasma is generated, phosphorous (P) ions present in plasma are accelerated by an RF electric field and are incident upon one surface of the semiconductor substrate 110a to perform ion doping.

After the plasma ion doping, an annealing process in which heating is performed at an appropriate temperature is preferred. The reason for this is that, unless the annealing process is performed, the doped ions act as simple impurities, but the doped ions are bonded to Si and are thus activated, when the annealing process is performed.

Meanwhile, the process for doping the n-type dopant is performed at a high temperature. During the doping process, a second byproduct layer 122 such as phosphor-silicate glass (PSG) is formed on the second semiconductor layer 120. The second byproduct layer 122 may be formed on the second semiconductor layer 120.

Figure 4F:
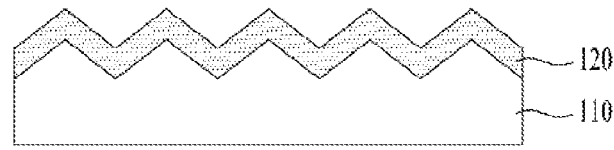

Next, as shown in FIG. 4F, the second byproduct layer 122 is removed.

The process of removing byproduct layer is carried out by wet etching an etchant.

Figure 4G:
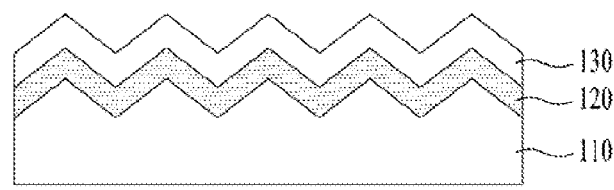

Next, as shown in FIG. 4G, an anti-reflective layer 130 is formed on the second semiconductor layer 120.

As the upper surface of the second semiconductor layer 120 has a roughness structure, the anti-reflective layer 130 also has a roughness structure.

The anti-reflective layer 130 is formed of silicon nitride or silicon oxide by plasma CVD.

Figure 4H:
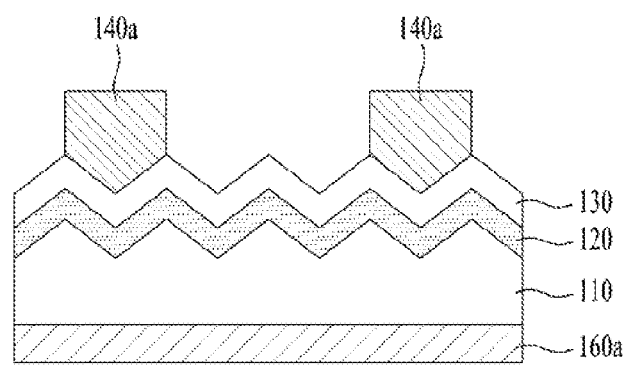

Next, as shown in FIG. 4H, the anti-reflective layer 130 is coated with a first electrode material 140a and the first semiconductor layer 110 is coated with a second electrode material 160a. More specifically, an upper surface of the anti-reflective layer 130 excluding the second semiconductor layer 120 is coated with the first electrode material 140a, and a lower surface of the first semiconductor layer 110 excluding the second semiconductor layer 120 is coated with the second electrode material 160a.

The process for coating the first electrode material 140a and the second electrode material 160a may include a printing process using a paste containing Ag, Al, Mg, Mn, Sb, Zn, Mo, Ni, Cu, or an alloy of two or more thereof, or a mixture of two or more types.

The first electrode material 140a is not formed over the entire surface of the anti-reflective layer 130 and is formed in a predetermined pattern, because it is formed on the surface upon which sunlight is incident.

The second electrode material 160a may be formed over the entire surface of the first semiconductor layer 110 because it is formed on the surface opposite to the surface upon which sunlight is incident. If desired, in order to make reflected sunlight incident upon the solar cell, the second electrode material 160a may be formed in a predetermined pattern.

Meanwhile, although not illustrated, prior to the process shown in FIG. 4H, the anti-reflective layer 130 and the second semiconductor layer 120 may be subjected to edge isolation to isolate an edge region.

Figure 4I:
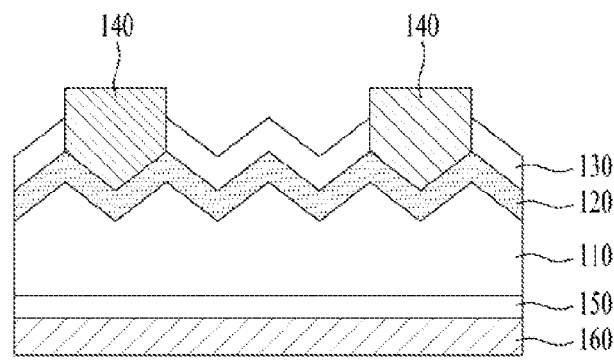

Next, as shown in FIG. 4I, manufacture of the solar cell according to one embodiment of the present invention is completed by firing the resulting structure at a high temperature.

When the resulting structure is fired at a high temperature, the first electrode material 140a passes through the anti-reflective layer 130 and permeates into the second semiconductor layer 120, to form a first electrode 140 that contacts the second semiconductor layer 120.

Also, as a result of firing at a high temperature, the second electrode material 160a permeates into a lower surface of the first semiconductor layer 110 and a third semiconductor layer 150 having a dopant concentration which is higher than that of the first semiconductor layer 110 is formed on a lower surface of the first semiconductor layer 110, and a second electrode 160 is formed on a lower surface of the third semiconductor layer 150. For example, when the first semiconductor layer 110 is formed of a p-type semiconductor, the third semiconductor layer 150 is formed of a p+-type semiconductor layer.

A manufacturing system for implementing a process for manufacturing a solar cell according to one embodiment of the present invention will be described in detail.

Figure 5:
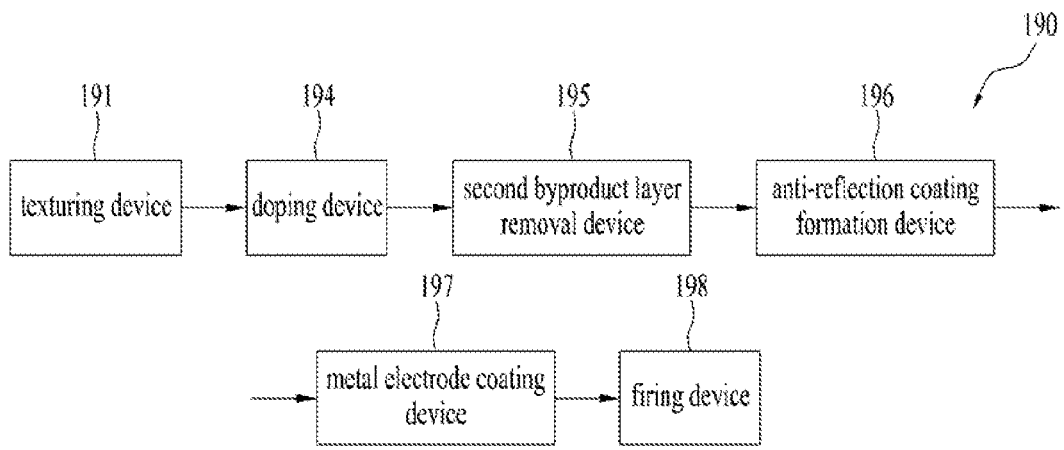
FIG. 5 is a block diagram schematically illustrating a system for manufacturing the solar cell according to a first embodiment of the present invention.

FIG. 5 is a block diagram schematically illustrating a system for manufacturing the solar cell according to a first embodiment of the present invention.

As shown in FIG. 5, the system for manufacturing the solar cell according to the embodiment includes a texturing device 191, a doping device, a second byproduct layer removal device 195, an anti-reflection coating formation device 196, a metal electrode coating device 197 and a firing device 198.

The texturing device 191 is preferably a reactive ion etching (RIE) device. At this time, the reactive ion etching (RIE) device performs the process (that is, texturing) shown in FIG. 4B and the process (that is, formation of the temporary layer T) shown in FIG. 4C.

That is, the RIE device textures the semiconductor substrate 110a and discharges gases remaining in the reactive ion etching device produced during texturing. Next, the RIE device injects at least one of a nitrogen (N)-based gas, a hydrogen (H)-based gas, an oxygen (O)-based gas, a fluorine (F)-based gas or a mixture thereof and applies plasma thereto to form a temporary layer T on the first byproduct layer 114 at a device inner temperature of 100° C. or less.

The reactive ion etching device may be selected from devices well-known in the art using a reaction gas under a plasma atmosphere.

The doping device performs the process shown in FIG. 4E and may be selected from devices well-known in the art that can perform doping by supplying a dopant gas under a plasma atmosphere and supplying the dopant gas to the high-temperature diffusion reactor.

Also, the doping device 194 may be used to perform the process shown in FIG. 4D. That is, prior to the doping, the doping device 194 accepts the semiconductor substrate 110a provided with the temporary layer T and then elevates an inner temperature of the doping device 194 to 150° C., which is lower than the doping temperature, and evaporates the first byproduct layer 114 and the temporary layer T, thereby simultaneously removing the first byproduct layer 114 and the temporary layer T.

The second byproduct layer removal device 195 performs the process shown in FIG. 4F and may be a wet etching device well-known in the art.

The anti-reflection coating formation device 196 performs the process shown in FIG. 4G and may use a plasma enhanced chemical vapor deposition (PECVD) device well-known in the art.

The metal electrode coating device 197 performs the process shown in FIG. 4H and may be selected from a variety of printing devices well-known in the art such as screen printing device.

The firing device performs the process shown in FIG. 4I and may be selected from a variety of firing devices well-known in the art.

As described above, the present invention can remove the first byproduct layer 114 without wet etching. For this reason, the present invention does not require a first etching device (that is, a wet etching device to remove the first byproduct layer 114), thus reducing equipment costs required for manufacture of the solar cell and considerably decreasing an amount of waste water discharged during wet etching, as compared to conventional methods requiring two wet etching devices.

Also, according to the present invention, a temporary layer T including the first byproduct layer 114 is formed to lower bonding force of the first byproduct layer 114 to the semiconductor substrate 110a, remove the first byproduct layer 114, and easily and completely remove the first byproduct layer 114. For this reason, the present invention prevents deterioration in efficiency of solar cell caused by the first byproduct layer 114.

Figure 6:
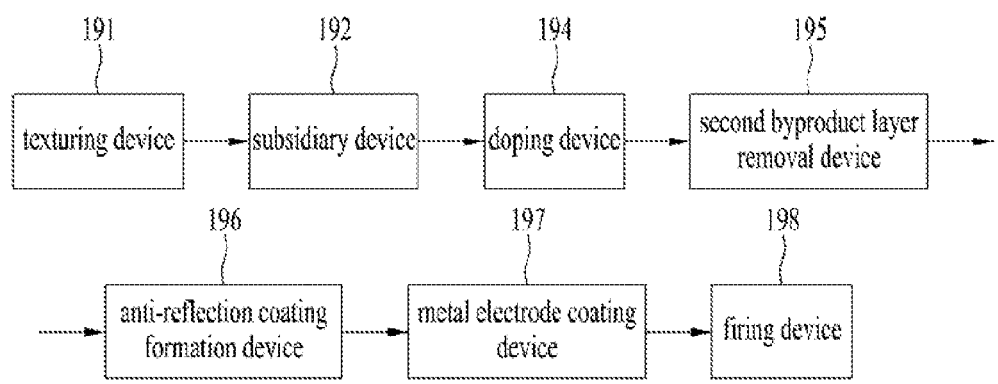
FIG. 6 is a block diagram schematically illustrating a system for manufacture of the solar cell according to one modified embodiment of the first embodiment of the present invention.
Figure 7:
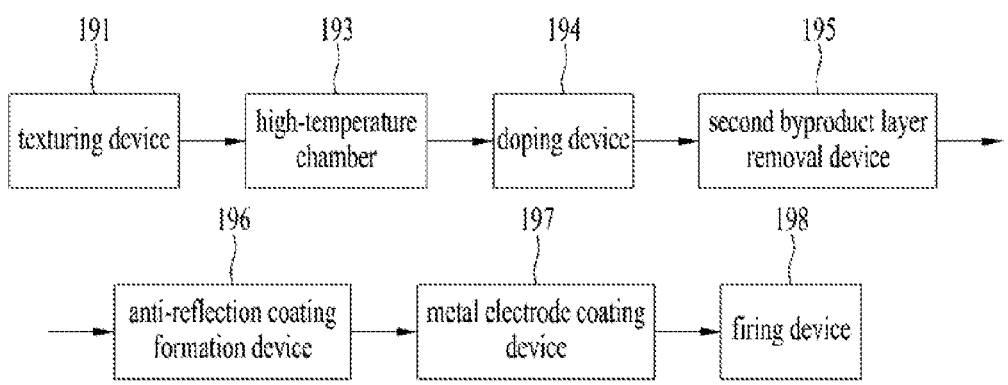
FIG. 7 is a block diagram schematically illustrating a system for manufacture of the solar cell according to another modified embodiment of the first embodiment of the present invention.
Figure 8:
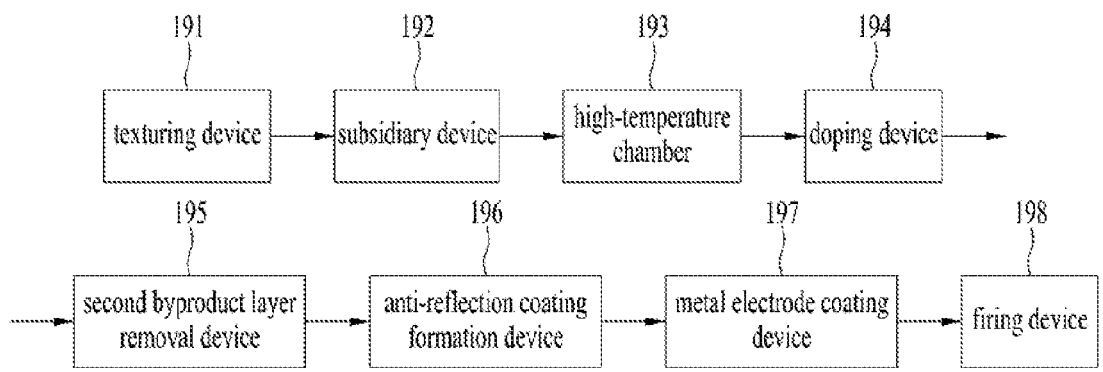
FIG. 8 is a block diagram schematically illustrating a system for manufacture of the solar cell according to yet another modified embodiment of the first embodiment of the present invention.

FIG. 6 is a block diagram schematically illustrating a system for manufacture of the solar cell according to one modified embodiment of the first embodiment of the present invention. FIG. 7 is a block diagram schematically illustrating a system for manufacture of the solar cell according to another modified embodiment of the first embodiment of the present invention. FIG. 8 is a block diagram schematically illustrating a system for manufacture of the solar cell according to yet another modified embodiment of the first embodiment of the present invention.

As shown in FIGS. 6 to 8, the system for manufacture of the solar cell according to the first embodiment of the present invention may further include at least one of a subsidiary device 192 which is a separate device to form the temporary layer T, and a high-temperature chamber 193 which is a separate device to remove the temporary layer T and the first byproduct layer 114.

Here, the subsidiary device 192 includes a gas inlet to supply a gas to form the temporary layer T, a gas outlet to discharge a remaining gas and a plasma applicator to apply plasma to the subsidiary device 192, and the high-temperature chamber 193 includes a gas outlet to discharge evaporated gases of the temporary layer T and the first byproduct layer 114 and a temperature controller (that is, a heater) to control an inner temperature of the high-temperature chamber 193.

Specifically, as shown in FIG. 6, the system for manufacture of the solar cell according to the present invention may include a texturing device 191, a subsidiary device 192, a doping device 194, a second byproduct layer removal device 195, an anti-reflection coating formation device 196, a metal electrode coating device 197 and a firing device 198.

Also, as shown in FIG. 7, the system for manufacture of the solar cell according to the present invention includes a texturing device 191, a high-temperature chamber 193, a doping device, a second byproduct layer removal device 195, an anti-reflection coating formation device 196, a metal electrode coating device 197 and a firing device 198 in accordance with a manufacturing process order.

Further, as shown in FIG. 8, the system for manufacture of the solar cell includes a texturing device 191, a subsidiary device 192, a high-temperature chamber 193, a doping device, a second byproduct layer removal device 195, an anti-reflection coating formation device 196, a metal electrode coating device 197, and a firing device 198 in accordance with a manufacturing process order.

FIGS. 9A to 9G are sectional views illustrating a method for manufacturing a solar cell according to a second embodiment of the present invention.

Figure 9A:
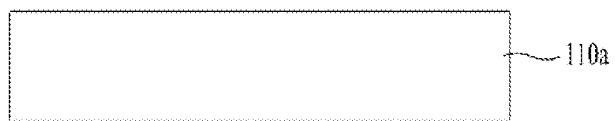
FIGS. 9A to 9G are sectional views illustrating a method for manufacturing a solar cell according to a second embodiment of the present invention.

First, as shown in FIG. 9A, a semiconductor substrate 110a is prepared.

The preparation of the semiconductor substrate 110a is performed by forming a wafer-shaped semiconductor substrate 110a with a silicon ingot using a diamond type sawing machine or a slurry type sawing machine, and removing sawing damage formed on the surface of the semiconductor substrate 110a due to the wafer sawing machine. The removal of the sawing damage may be carried out by wet etching.

The semiconductor substrate 110a may be a silicon substrate, for example, a p-type silicon substrate.

The silicon substrate may utilize monocrystalline silicon or polycrystalline silicon. The monocrystalline silicon exhibits high solar cell efficiency due to high purity and low crystal defect density, but disadvantageously has low economic efficiency due to excessively high price. The polycrystalline silicon has relatively low efficiency, but has a low manufacturing cost due to use of low-cost materials and processes, thus being suitable for mass-production.

Figure 9B:
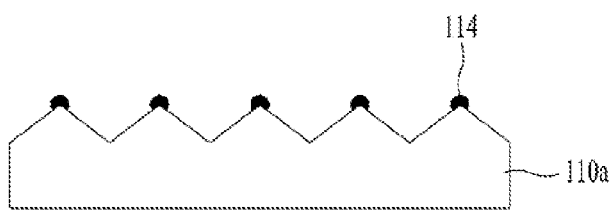

Next, as shown in FIG. 9B, one surface of the semiconductor substrate 110a is etched using the texturing device 191 to form a roughness structure on the semiconductor substrate 110a. That is, one surface of the semiconductor substrate 110a is subjected to texturing.

The texturing is carried out by dry etching.

In particular, preferably, the texturing may be carried out using reactive ion etching (RIE).

The reactive ion etching may be carried out using $C_{12}$, $SF_6$, $NF_3$, HBr, or a mixture of two or more thereof as a major gas and Ar, $O_2$, $N_2$, He, or a mixture of two or more thereof as an additive gas.

As such, when the semiconductor substrate 110a is etched using reactive ion etching, the first byproduct layer 114 may remain on one surface of the semiconductor substrate 110a due to high-voltage plasma, and the first byproduct layer includes a damaged layer formed on one surface of the semiconductor substrate, and/or a reaction product such as SiOx or a reaction product containing a substance based on Si—O—F—S formed on peaks of the roughness. For clearer description, in accordance with the method for manufacturing a solar cell according to the present invention, the first byproduct layer contains a reaction product such as SiOx or a reaction product containing a substance based on Si—O—F—S formed on peaks of the roughness. Hereinafter, the description according to the embodiment is made based on a process for removing the reaction products.

The first byproduct layer 114 is made of a Si-based substance and the semiconductor substrate 110a is also made of Si. For this reason, the first byproduct layer 114 is strongly bonded to the semiconductor substrate 110a.

In order to remove the first byproduct layer 114, according to the present invention, a temporary layer T is formed on one surface of the semiconductor substrate 110a such that the temporary layer T surrounds the first byproduct layer 114, and the first byproduct layer 114 and the temporary layer T are then simultaneously removed. This is performed during the doping step as described below.

Figure 9C:
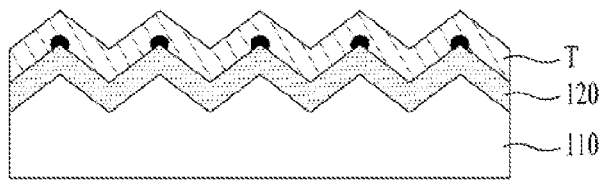

Next, as shown in FIG. 9C, one surface of the semiconductor substrate 110a is doped with a dopant to form a PN junction layer including a first semiconductor layer 110 and a second semiconductor layer 120 that is disposed on the first semiconductor layer 110 and has a polarity different from the first semiconductor layer 110. That is, when one surface of the semiconductor substrate 110a is doped with a dopant, the first semiconductor layer 110 not doped with the dopant and the second semiconductor layer 120 doped with a dopant are sequentially formed to constitute the PN junction.

For example, when the semiconductor substrate 110a is realized with a p-type semiconductor layer, a first semiconductor layer 110 formed of a p-type semiconductor layer and a second semiconductor layer 120 formed of the n-type semiconductor layer can be formed on one surface of the first semiconductor layer 110 by doping the n-type dopant.

More specifically, the doping process may be carried out using high-temperature diffusion or plasma ion doping.

The process for doping the n-type dopant using high-temperature diffusion includes loading the semiconductor substrate 110a in a diffusion reactor at a high temperature of about 800° C. or more and supplying an n-type dopant gas such as $POCl_3$ or $PH_3$ to the diffusion reactor to diffuse the n-type dopant into the surface of the semiconductor substrate 110a.

The process for doping the n-type dopant using the plasma ion doping may include loading the semiconductor substrate 110a in a plasma generator and supplying an n-type dopant gas such as $POCl_3$ or $PH_3$ thereto to generate plasma. When plasma is generated, phosphorous (P) ions present in plasma are accelerated by an RF electric field and are incident upon one surface of the semiconductor substrate 110a to perform ion doping.

After the plasma ion doping, an annealing process in which heating is performed at an appropriate temperature is preferred. The reason for this is that, unless the annealing process is performed, the doped ions act as simple impurities, but the doped ions are bonded to Si and are thus activated, when the annealing process is performed.

The doping process is performed such that the PN junction structure including the first semiconductor layer 110 and the second semiconductor layer 120 is formed and the second byproduct layer 122 such as phosphor-silicate glass (PSG) is formed on the first byproduct layer 114 and on the second semiconductor layer 120 to a predetermined thickness using a process for doping an n-type dopant at a high temperature on the second semiconductor layer 120. That is, the doping process is performed such that the second byproduct layer 122 surrounds upper surfaces of the first byproduct layer 114 and the semiconductor substrate 110a.

In other words, in the present embodiment, the second byproduct layer 122 becomes the temporary layer T removed together with the first byproduct layer 114.

Preferably, the doping process may be performed until the second byproduct layer 122 is grown to sufficiently include the first byproduct layer 114.

By performing doping such that the second byproduct layer 122 such as PSG includes or surrounds the first byproduct layer 114, a Si component of the first byproduct layer 114 and/or the semiconductor substrate 110a can be incorporated or diffused into a Si component of the second byproduct layer 122. For this reason, the first byproduct layer 114 diffuses the Si component into the second byproduct layer 122, thus reducing a Si component concentration of the first byproduct layer 114 and considerably reducing bonding force between the semiconductor substrate 110a and the first byproduct layer 114. That is, the second byproduct layer 122 facilitates peel of the first byproduct layer 114.

Figure 9D:
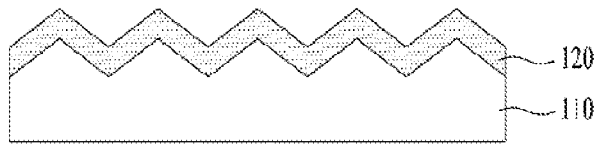

Next, as shown in FIG. 9D, the first byproduct layer 114 and the second byproduct layer 122 formed on the first byproduct layer 114 are simultaneously removed.

The removal of the second byproduct layer 122 is performed using wet etching using the second wet etching device.

As such, without using separate wet etching and a wet etching device to remove the first byproduct layer 114, the first byproduct layer 114 can be easily and completely removed using the second wet etching device. As a result, the present invention does not require the first wet etching device, thus reducing equipment costs required for manufacture of the solar cell and considerably reducing an amount of waste water discharged during wet etching, as compared to a conventional method requiring two wet etching devices.

Figure 9E:
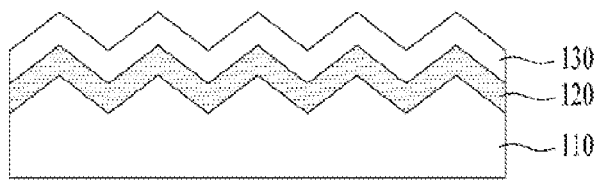

Next, as shown in FIG. 9E, an anti-reflective layer 130 is formed on the second semiconductor layer 120.

As the upper surface of the second semiconductor layer 120 has a roughness structure, the anti-reflective layer 130 also has a roughness structure.

The anti-reflective layer 130 is formed of silicon nitride or silicon oxide by plasma CVD.

Figure 9F:
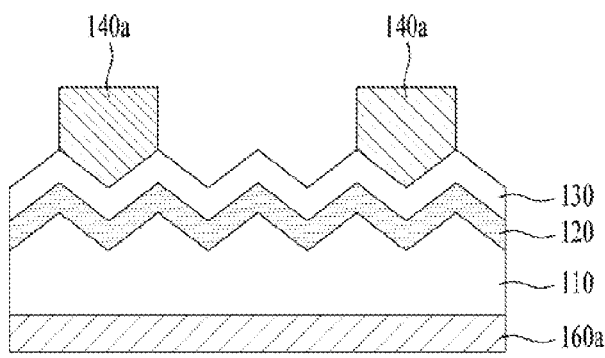

Next, as shown in FIG. 9F, the anti-reflective layer 130 is coated with a first electrode material 140a and the first semiconductor layer 110 is coated with a second electrode material 160a. More specifically, an upper surface of the anti-reflective layer 130 excluding the second semiconductor layer 120 is coated with the first electrode material 140a, and a lower surface of the first semiconductor layer 110 excluding the second semiconductor layer 120 is coated with the second electrode material 160.

The process for coating the first electrode material 140a and the second electrode material 160a may include a printing process using a paste containing Ag, Al, Mg, Mn, Sb, Zn, Mo, Ni, Cu, or an alloy of two or more thereof, or a mixture of two or more types.

The first electrode material 140a is not formed over the entire surface of the anti-reflective layer 130 and is formed in a predetermined pattern because it is formed on the surface upon which sunlight is incident.

The second electrode material 160a may be formed over the entire surface of the first semiconductor layer 110 because it is formed on the surface opposite to the surface upon which sunlight is incident. If desired, in order to make reflected sunlight incident upon solar cell, the second electrode material 160a may be formed in a predetermined pattern.

Meanwhile, although not illustrated, prior to the process shown in FIG. 9F, the anti-reflective layer 130 and the second semiconductor layer 120 may be subjected to edge isolation to isolate an edge region.

Figure 9G:
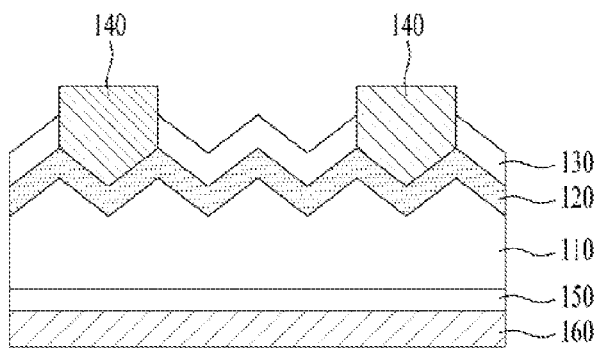

Next, as shown in FIG. 9G, the solar cell according to one embodiment of the present invention is completely manufactured by firing the resulting structure at a high temperature.

When the resulting structure is fired at a high temperature, the first electrode material 140a passes through the anti-reflective layer 130 and permeates into the second semiconductor layer 120, to form a first electrode 140 that contacts the second semiconductor layer 120.

Also, as a result of firing at a high temperature, the second electrode material 160a permeates into a lower surface of the first semiconductor layer 110 and a third semiconductor layer 150 having a dopant concentration which is higher than that of the first semiconductor layer 110 is formed on a lower surface of the first semiconductor layer 110, and a second electrode 160 is formed on a lower surface of the third semiconductor layer 150. For example, when the first semiconductor layer 110 is formed of a p-type semiconductor, the third semiconductor layer 150 is formed of a p+-type semiconductor layer.

As described above, in accordance with the present invention, the first byproduct layer 114 can be removed without wet etching after dry texturing. For this reason, the present invention does not need the first wet etching device, thus reducing equipment cost required for manufacture of the solar cell and considerably decreasing an amount of waste water discharged during wet etching, as compared to conventional methods requiring two wet etching devices.

Also, according to the present invention, a temporary layer T including the first byproduct layer 114 is formed to lower bonding force of the first byproduct layer 114 to the semiconductor substrate 110a, remove the first byproduct layer 114 and easily and completely remove the first byproduct layer 114. For this reason, the present invention prevents deterioration in solar cell efficiency caused by the first byproduct layer 114.

A manufacturing system for implementing a process for manufacturing a solar cell according to a second embodiment of the present invention will be described in detail.

Figure 10:
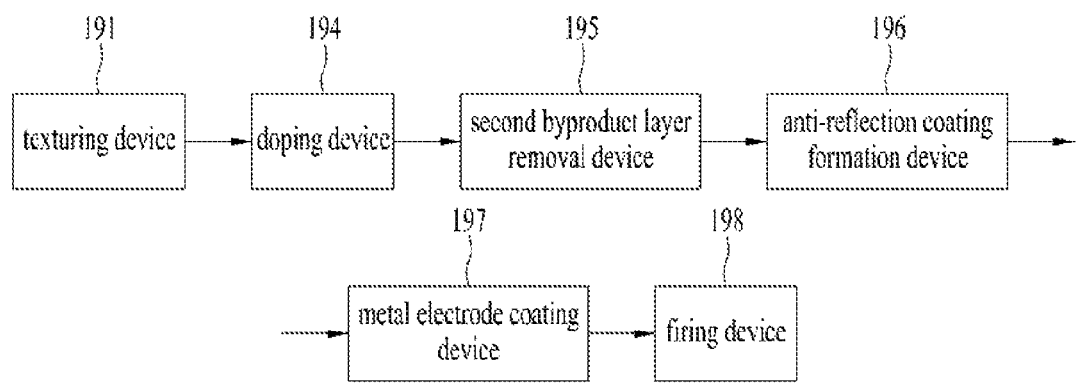
FIG. 10 is a block diagram schematically illustrating a system for manufacture of the solar cell according to the second embodiment of the present invention.

FIG. 10 is a block diagram schematically illustrating a system for manufacture of the solar cell according to the second embodiment of the present invention.

As shown in FIG. 10, the system for manufacture of the solar cell according to the embodiment includes a texturing device 191, a doping device 194, a second byproduct layer removal device 195, an anti-reflection coating formation device 196, a metal electrode coating device 197 and a firing device 198.

The texturing device 191 is preferably a reactive ion etching (RIE) device. At this time, the reactive ion etching (RIE) device performs the process (that is, texturing) shown in FIG. 4B.

That is, the RIE device textures the semiconductor substrate 110a and discharges gases remaining in the reactive ion etching device produced during texturing. Next, the RIE device injects at least one of a nitrogen (N)-based gas, a hydrogen (H)-based gas, an oxygen (O)-based gas, a fluorine (F)-based gas and a mixture thereof and applies plasma thereto to form a temporary layer T on the first byproduct layer 114 at a device inner temperature of 100° C. or less.

Also, the doping device may be used to perform the process shown in FIG. 9C and may be selected from devices well-known in the art that can perform doping by supplying a dopant gas under a plasma atmosphere and supplying the dopant gas to the high-temperature diffusion reactor.

The second byproduct layer removal device 195 performs the process shown in FIG. 9D and may be a wet etching device well-known in the art. As described above, the second byproduct layer removal device 195 simultaneously removes the first byproduct layer 114 and the second byproduct layer 122 which is the temporary layer T formed on the first byproduct layer 114.

The anti-reflection coating formation device 196 performs the process shown in FIG. 9E and may be a plasma enhanced chemical vapor deposition (PECVD) device well-known in the art.

The metal electrode coating device 197 performs the process shown in FIG. 9F and may be selected from a variety of printing devices well-known in the art such as screen printing device.

The firing device 198 performs the process shown in FIG. 9G and may be selected from a variety of firing devices well-known in the art.

As described above, the present invention can remove the first byproduct layer 114 without wet etching. For this reason, the present invention does not require a first etching device (that is, a wet etching device to remove the first byproduct layer 114), thus reducing equipment cost required for manufacture of the solar cell and considerably decreasing an amount of waste water discharged during wet etching, as compared to conventional methods requiring two wet etching devices.

Also, according to the present invention, a temporary layer T including the first byproduct layer 114 is formed to lower bonding force of the first byproduct layer 114 to the semiconductor substrate 110a, remove the first byproduct layer 114 and easily and completely remove the first byproduct layer 114. For this reason, the present invention prevents deterioration in solar cell efficiency caused by the first byproduct layer 114.

Although not shown, in a modified embodiment, the present invention includes forming a temporary layer twice. That is, the method for manufacturing a solar cell according to the modified embodiment includes formation of a temporary layer included in the method for manufacturing a solar cell according to the first embodiment and a doping process (that is, a process for forming a second byproduct layer as a temporary layer) included in the method for manufacturing a solar cell according to the second embodiment.

Specifically, forming a temporary layer and simultaneously removing the first byproduct layer and the temporary layer included in the method for manufacture of a solar cell according to the first embodiment, and forming a second byproduct layer on the remaining first byproduct layer and removing the second byproduct layer included in the method for manufacturing a solar cell according to the second embodiment are performed.

The present invention includes two processes of forming the temporary layer and two processes of removing the temporary layer and the first byproduct layer, thus enabling complete removal of the first byproduct layer. This case does not require the first etching device according to the conventional method, thus reducing equipment costs and considerably decreasing waste water caused by use of wet etching devices, as compared to conventional methods.

FIGS. 11A to 11G are sectional views illustrating a process of manufacturing a solar cell according to one embodiment of the present invention.

Figure 11A:
FIGS. 11A to 11G are sectional views illustrating a process of manufacturing a solar cell according to one embodiment of the present invention.

First, as shown in FIG. 11A, a semiconductor substrate 110a is prepared.

The semiconductor substrate 110a may be a silicon substrate, for example, a p-type silicon substrate.

The silicon substrate may utilize monocrystalline silicon or polycrystalline silicon. The monocrystalline silicon exhibits high solar cell efficiency due to high purity and low crystal defect density, but disadvantageously has low economic efficiency due to excessively high price. The polycrystalline silicon has relatively low efficiency, but has a low manufacturing cost due to use of low-cost materials and processes, thus being suitable for mass-production.

Figure 11B:

Next, as shown in FIG. 11B, a roughness structure is formed on one surface of the semiconductor substrate 110a by etching one surface of the semiconductor substrate 110a. Although not shown, roughness structures can be formed on both the one surface and other surface of the semiconductor substrate 110a by etching both the one surface and other surface of the semiconductor substrate 110a.

The etching one surface of the semiconductor substrate 110a is carried out using reactive ion etching (RIE).

The reactive ion etching may be carried out using $C_{12}$, $SF_6$, $NF_2$, HBr, or a mixture of two or more thereof as a major gas and Ar, $O_2$, $N_2$, He, or a mixture of two or more thereof as an additive gas. In particular, the reactive ion etching is carried out using a mixed gas of $SF_6$, $O_2$ and $C_{22}$.

When the reactive ion etching is used, a RF power is preferably 15 to 30 kw and an inner pressure of the chamber is 0.15 to 0.5 torr.

When the RF power is lower than 15 kw, one surface of the semiconductor substrate 110a may not be etched, and when the RF power exceeds 30 kw, the one surface of the semiconductor substrate 110a may be excessively etched and a desired roughness structure may not be formed.

When the inner pressure of the chamber is lower than 0.15 torr, a plasma state may disadvantageously become unstable and when the inner pressure of the chamber exceeds 0.5 torr, etching speed may be disadvantageously reduced.

Also, when the reactive ion etching is performed using a mixed gas of $SF_6$, $O_2$ and $Cl_2$, a mix ratio of the mixed gas (sccm) is preferably $SF_6:O_2:C_{12}$=(0.5 to 1.5):1:(0.5 to 1).

The $SF_6$ serves as a major etching gas to etch one surface of the semiconductor substrate 110a. When the content of $SF_6$ is lower than the range defined above, the etching one surface of the semiconductor substrate 110a may not be smoothly performed, and when the content of SF6 exceeds the range defined above, the desired roughness structure may not be obtained.

$O_2$ serves as a mask to block etching and enables one surface of the semiconductor substrate 110a to be selectively etched. When the content of $O_2$ is outside this range, the desired roughness structure may not be obtained.

$Cl_2$ functions to aid etching of one surface of the semiconductor substrate 110a. When the content of $Cl_2$ is lower than the range defined above, etching may be slow and an excessively sharp roughness structure may be formed and when the content of $Cl_2$ exceeds the range defined above, the roughness structure may not be obtained due to excessive etching.

When the semiconductor substrate 110a is etched using reactive ion etching under reaction conditions described above, a roughness structure is formed on one surface of the semiconductor substrate 110a. The roughness structure has sharp peaks and a width of about 110 to about 150 nm. Also, the roughness structure has a height corresponding to 0.8 to 1.2 times the width of the roughness structure.

As such, when one surface of the semiconductor substrate 110a is etched using reactive ion etching, the first byproduct layer 114 remains on one surface of the semiconductor substrate 110a due to high-voltage plasma, and the first byproduct layer 114 includes a damaged layer 114b formed on one surface of the semiconductor substrate, and/or a reaction product 114a such as SiOx or a reaction product 114a containing a substance based on Si—O—F—S formed on peaks of the roughness. For clearer description, in accordance with the method for manufacturing a solar cell according to the present invention, the first byproduct layer contains a reaction product 114a such as $SiO_x$ or a reaction product 114a containing a substance based on Si—O—F—S formed on peaks of the roughness, and a damaged layer 114b. Hereinafter, the description according to the embodiment is made based on a process for removing the reaction products and the damaged layer.

Figure 11C:
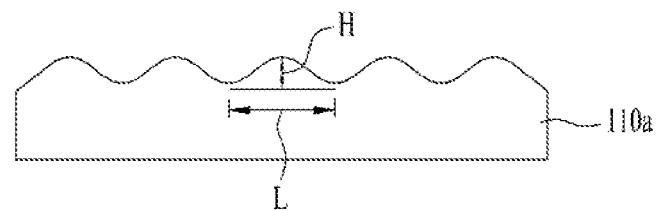

Next, as shown in FIG. 11C, the first byproduct layer 114 including the damaged layer 114b and the reaction product 114a formed on one surface of the semiconductor substrate 110a is removed. That is, the damaged layer 114b and the reaction product 114a formed on one surface of the semiconductor substrate 110a are simultaneously removed.

The removal of first byproduct layer formed on one surface of the semiconductor substrate 110a (that is, simultaneous removal of the damaged layer 114b and the reaction product 114a) is carried out using reactive ion etching (RIE), like the process shown in FIG. 11B.

At this time, reactive ion etching may be carried out using a mixed gas of $SF_6$ and $Cl_2$.

In this case, preferably, RF power is 7 to 15 kw and an inner pressure of the chamber is 0.2 to 0.5 torr.

When the RF power is lower than 7 kw, the damaged layer 114b and the reaction product 114a may not be etched, and when the RF power exceeds 15 kw, one surface of the semiconductor substrate 110a may be excessively etched.

When the inner pressure of the chamber is lower than 0.2 torr, a plasma state may disadvantageously become unstable and when the inner pressure of the chamber exceeds 0.5 torr, etching speed may be disadvantageously reduced.

Also, when the reactive ion etching is performed using the mixed gas of $SF_6$ and $Cl_2$, a mix ratio of the gas (sccm) is preferably $SF_6:Cl_2=3:(1$ to $3)$.

When the content of $SF_6$ is lower than the range defined above, the damaged layer 114b and the reaction product 114a may be not smoothly etched, and when the content of $SF_6$ exceeds the range defined above, the formed roughness structure may be greatly deformed.

When the content of $Cl_2$ is lower than the range defined above, etching may be slow and when the content of $Cl_2$ exceeds the range defined above, the roughness structure may not be obtained due to excessive etching.

The process shown in FIG. 11C may be continuously performed in the same equipment as the process shown in FIG. 11B by changing only process conditions such as process gas. As a result, substantial addition of processes or process equipment does not occur.

When the damaged layer 114b and the reaction product 114a are simultaneously removed using reactive ion etching under the conditions described above, the roughness structure produced during the process shown in FIG. 11B may be changed.

That is, peaks of the roughness structure are changed to have a round-shaped cross-section. The finally obtained roughness structure may have a width (L) of about 110 to about 150 nm and the roughness structure may have a height (H) of about 50 to about 140 nm.

Figure 11D:
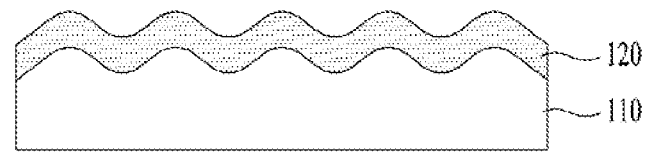

Next, as shown in FIG. 11D, one surface of the semiconductor substrate 110a is doped with a dopant to form a PN junction layer including a first semiconductor layer 110 and a second semiconductor layer 120 that is disposed on the first semiconductor layer 110 and has a polarity different from the first semiconductor layer 110. That is, when one surface of the semiconductor substrate 110a is doped with a dopant, the first semiconductor layer 110 not doped with the dopant and the second semiconductor layer 120 doped with a dopant are sequentially form to constitute the PN junction.

For example, when the semiconductor substrate 110a is realized with a p-type semiconductor layer, a first semiconductor layer 110 formed of a p-type semiconductor layer and a second semiconductor layer 120 formed of the n-type semiconductor layer can be formed on one surface of the first semiconductor layer 110 by doping the n-type dopant.

One surface of the second semiconductor layer 120, specifically, an upper surface of the second semiconductor layer 120 includes the roughness structure described above, one surface of the first semiconductor layer 110, specifically, the upper surface of the first semiconductor layer 110 also includes a similar roughness structure. A roughness structure different from the roughness structure included in the second semiconductor layer 120 may be formed on the upper surface of the first semiconductor layer 110 depending on the diffusion level of doped dopant.

The process for doping the dopant may be carried out using high-temperature diffusion or plasma ion doping.

The process for doping the n-type dopant using high-temperature diffusion includes loading the semiconductor substrate 110a in a diffusion reactor at a high temperature of about 800° C. or more and supplying an n-type dopant gas such as $POCl_3$ or $PH_3$ to the diffusion reactor to diffuse the n-type dopant into the surface of the semiconductor substrate 110a.

The process for doping the n-type dopant using plasma ion doping may include loading the semiconductor substrate 110a in a plasma generator and supplying an n-type dopant gas such as $POCl_3$ or $PH_3$ thereto to generate plasma. When plasma is generated, phosphorous (P) ions present in plasma are accelerated by an RF electric field and are incident upon one surface of the semiconductor substrate 110a to perform ion doping.

After plasma ion doping, an annealing process in which heating is performed at an appropriate temperature is preferred. The reason for this is that, unless the annealing process is performed, the doped ions act as simple impurities, but the doped ions are bonded to Si and are thus activated, when the annealing process is performed.

Meanwhile, doping the n-type dopant is carried out at a high temperature. In this doping process, the second byproduct layer such as phosphor-silicate glass (PSG) may be formed on the second semiconductor layer 120. Accordingly, etching such as wet etching may be further performed in order to remove the second byproduct layer.

Figure 11E:
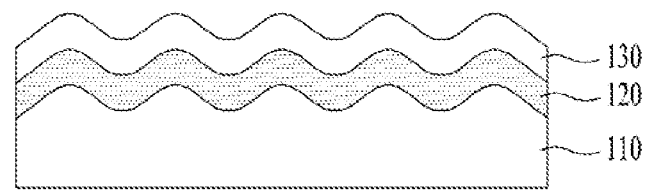

Next, as shown in FIG. 11E, an anti-reflective layer 130 is formed on the second semiconductor layer 120.

As the upper surface of the second semiconductor layer 120 has a roughness structure, the anti-reflective layer 130 also has a similar roughness structure.

The anti-reflective layer 130 may be formed of silicon nitride or silicon oxide using plasma CVD.

Figure 11F:
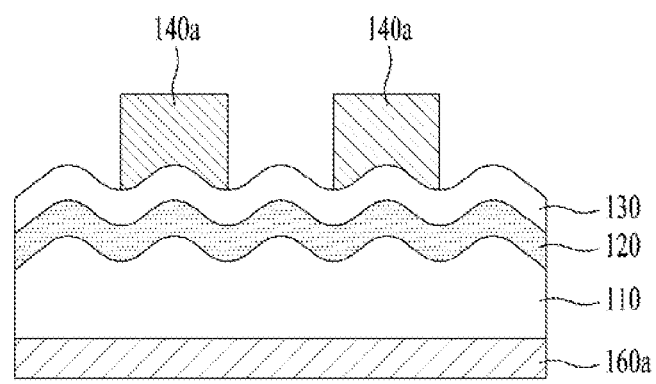

Next, as shown in FIG. 11F, the anti-reflective layer 130 is coated with a first electrode material 140a and the first semiconductor layer 110 is coated with a second electrode material 160a. More specifically, an upper surface of the anti-reflective layer 130 excluding the second semiconductor layer 120 is coated with the first electrode material 140a, and a lower surface of the first semiconductor layer 110 excluding the second semiconductor layer 120 is coated with the second electrode material 160.

The first electrode material 140a and the second electrode material 160a may include a printing process using a paste containing Ag, Al, Ti, Mo, Ni, Cu, or a mixture of two or more types or an alloy of two or more thereof.

The first electrode material 140a is not formed over the entire surface of the anti-reflective layer 130 and is formed in a predetermined pattern, because it is formed on the surface upon which sunlight is incident.

The second electrode material 160a may be formed over the entire surface of the first semiconductor layer 110 because it is formed on the surface opposite to the surface upon which sunlight is incident. If desired, in order to make reflected sunlight incident upon solar cell, the second electrode material 160a may be formed in a predetermined pattern.

Figure 11G:
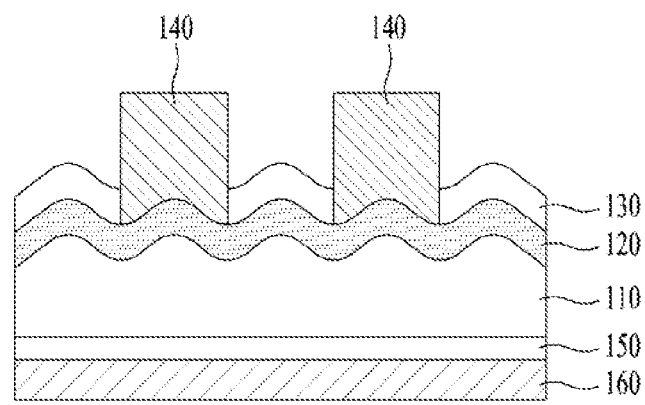

Next, as shown in FIG. 11G, the solar cell according to one embodiment of the present invention is completely manufactured by firing the resulting structure at a high temperature.

When the resulting structure is fired at a high temperature, the first electrode material 140a passes through the anti-reflective layer 130 and permeates into the second semiconductor layer 120, to form a first electrode 140 that contacts the second semiconductor layer 120.

Also, as a result of firing at a high temperature, the second electrode material 160a permeates into a lower surface of the first semiconductor layer 110 and a third semiconductor layer 150 having a dopant concentration which is higher than that of the first semiconductor layer 110 is formed on a lower surface of the first semiconductor layer 110, and a second electrode 160 is formed on a lower surface of the third semiconductor layer 150. For example, when the first semiconductor layer 110 is formed of a p-type semiconductor, the third semiconductor layer 150 is formed of a p+-type semiconductor layer.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

The invention claimed is:

1. A method for manufacturing a solar cell comprising steps of:
   texturing a surface of a semiconductor substrate in a texturing device to etch the surface of the semiconductor substrate in the texturing device and thereby form a roughness structure on the surface of the semiconductor substrate;
   forming a temporary layer on the surface of the semiconductor substrate such that the temporary layer surrounds a first byproduct layer formed in a predetermined region on the surface of the semiconductor substrate during the step of texturing; and
   doping the surface of the semiconductor substrate with a dopant in a doping device to form a first semiconductor layer and a second semiconductor layer disposed on the first semiconductor layer and having a polarity different from that of the first semiconductor layer, and
   wherein the first byproduct layer and the temporary layer are simultaneously removed.

2. The method according to claim 1, wherein the step of texturing is carried out by dry etching.

3. The method according to claim 1, wherein the step of forming a temporary layer is continuously performed in the texturing device after completion of the step of texturing.

4. The method according to claim 3, wherein the step of forming a temporary layer comprises steps of:
   loading the semiconductor substrate in the texturing device after the step of texturing;
   injecting at least one of a nitrogen (N)-based gas, a hydrogen (H)-based gas, an oxygen (O)-based gas, a fluorine (F)-based gas and a mixture thereof into the texturing device;
   applying plasma to the texturing device; and
   adjusting an inner temperature of the texturing device to a predetermined first temperature.

5. The method according to claim 4, wherein the predetermined first temperature is 100° C. or less.

6. The method according to claim 1, wherein the step of forming a temporary layer is carried out in a subsidiary device provided between the texturing device and the doping device.

7. The method according to claim 6, wherein the forming a temporary layer comprises steps of:
   loading the semiconductor substrate in the subsidiary device;
   injecting at least one of a nitrogen (N)-based gas, a hydrogen (H)-based gas, an oxygen (O)-based gas, a fluorine (F)-based gas and a mixture thereof into the subsidiary device;
   applying plasma to the subsidiary device; and
   adjusting an inner temperature of the subsidiary device to a predetermined first temperature.

8. The method according to claim 7, wherein the predetermined first temperature is 100° C. or less.

9. The method according to claim 1, wherein the simultaneous removal of the first byproduct layer and the temporary layer comprises steps of:
   loading the semiconductor substrate in the doping device;
   elevating an inner temperature of the doping device to a predetermined second temperature lower than a doping temperature; and
   evaporating the first byproduct layer and the temporary layer.

10. The method according to claim 9, wherein the step of doping is carried out after the step of evaporating the first byproduct layer and the temporary layer and then discharging gases left in the doping device.

11. The method according to claim 1, wherein the simultaneous removal of the first byproduct layer and the temporary layer comprises steps of:
   loading the semiconductor substrate in a high-temperature chamber disposed between the texturing device and the doping device;
   elevating an inner temperature of the high-temperature chamber to a predetermined second temperature; and
   evaporating the first byproduct layer and the temporary layer.

12. The method according to claim 9 or 11, wherein the predetermined second temperature is 150° C. or more.

13. A method for manufacturing a solar cell comprising steps of: texturing a surface of a semiconductor substrate in a texturing device to etch the surface of the semiconductor substrate and thereby form a roughness structure on the surface of the semiconductor substrate;
   doping the surface of the semiconductor substrate with a dopant in the doping device to form a first semiconductor layer and a second semiconductor layer disposed on the first semiconductor layer and having a polarity different from that of the first semiconductor layer; and
   removing a first byproduct layer formed on the second semiconductor layer during the step of doping, wherein a temporary layer is formed on the surface of the semiconductor substrate such that the temporary layer surrounds the first byproduct layer formed in a predetermined region on the surface of the semiconductor substrate during the step of texturing, and the first byproduct layer and the temporary layer are simultaneously removed.

14. The method according to claim 13, wherein the temporary layer is a second byproduct layer.

15. The method according to claim 14, wherein the step of doping is carried out such that the second byproduct layer surrounds the upper surfaces of the first byproduct layer and the semiconductor substrate.

16. The method according to claim 14, wherein both the first byproduct layer and the temporary layer are removed during the step of removing the first byproduct layer.

17. The method according to claim 13, wherein the step of removing the first byproduct layer is carried out by wet etching.

18. A method for manufacturing a solar cell comprising steps of: texturing a surface of a semiconductor substrate to etch the surface of a semiconductor substrate by reactive ion etching and thereby form a roughness structure on the surface of the substrate; and simultaneously removing a first byproduct layer including a damaged layer and a reaction product formed on the surface of the semiconductor substrate and a temporary layer on the surface of the semiconductor substrate formed to surround the first byproduct layer in a predetermined region on the surface of the semiconductor substrate during the step of texturing by the reactive ion etching, wherein the step of removing a first byproduct layer is carried out such that a peak of the roughness structure has a round shape.

19. The method according to claim 18, wherein the round shaped roughness structure has a width (L) of 100 nm to 500 nm and a height (H) of 50 nm to 400 nm.

20. The method according to claim 18, wherein the step of removing the first byproduct layer and the temporary layer is carried out using a mixed gas of $SF_6$ and $Cl_2$, and a mix ratio (sccm) of $SF_6$ and $Cl_2$ is $SF_6:Cl_2=3:(1$ to $3)$.

21. The method according to claim 18, wherein the step of removing the first byproduct layer and the temporary layer is carried out at an RF power of 7 to 15 Kw and at an inner pressure of a chamber of 0.2 to 0.5 torr.

22. The method according to claim 18, wherein the step of texturing and the step of removing the first byproduct layer and the temporary layer are continuously performed in the same reactive ion etching equipment.

\* \* \* \* \*